US009984502B2

(12) United States Patent
Jones et al.

(10) Patent No.: US 9,984,502 B2
(45) Date of Patent: May 29, 2018

(54) CREATING THREE DIMENSIONAL MODELS WITH ACCELERATION DATA (71) Applicant: International Business Machines Corporation, Armonk, NY (US)

(72) Inventors: Christopher P. Jones, Las Vegas, NV (US); Jonathan Lenchner, North Salem, NY (US); Nathan Masters, Henderson, NV (US); Daniel A. Mazzella, Henderson, NV (US); James A. Oravec, Las Vegas, NV (US); Rodrigo A. Rey, Las Vegas, NV (US)

(73) Assignee: International Business Machines Corporation, Armonk, NY (US)

( * ) Notice: Subject to any disclaimer, the term of this patent is extended or adjusted under 35 U.S.C. 154(b) by 858 days.

(21) Appl. No.: 14/011,154

(22) Filed: Aug. 27, 2013

(65) Prior Publication Data

US 2015/0066439 A1 Mar. 5, 2015

(51) Int. Cl.
*G06F 17/50* (2006.01)
*G06T 17/00* (2006.01)
*G06T 17/20* (2006.01)
*G06T 15/20* (2011.01)
*G06F 3/041* (2006.01)
*G06T 19/00* (2011.01)

(52) U.S. Cl.
CPC ............ *G06T 17/20* (2013.01); *G06F 3/0416* (2013.01); *G06F 17/50* (2013.01); *G06T 15/205* (2013.01); *G06T 17/00* (2013.01)

(58) Field of Classification Search
CPC ........... G06F 17/50; G06F 17/00; G06F 19/00

USPC ........................................................... 703/1
See application file for complete search history.

(56) References Cited

U.S. PATENT DOCUMENTS

| 7,814,441 | B2 | 10/2010 | Bae et al. |
| 8,976,172 | B2 | 3/2015 | Jones |
| 2006/0154198 | A1 | 7/2006 | Durbin et al. |
| 2008/0036755 | A1 | 2/2008 | Bae et al. |
| 2009/0306509 | A1 | 12/2009 | Pedersen et al. |

(Continued)

FOREIGN PATENT DOCUMENTS

| WO | 2010095107 A1 | 8/2010 |
| WO | 2013010910 A1 | 1/2013 |
| WO | 2015173173 A1 | 11/2015 |

OTHER PUBLICATIONS

Naqvi et al. "Step Counting Using Smartphone-Based Accelerometer", International Journal on Computer Science and Engineering (IJCSE), vol. 4, No. 05, May 2012, pp. 675-681.*

(Continued)

*Primary Examiner* — Dwin M Craig
(74) *Attorney, Agent, or Firm* — Stephen R. Yoder (57) ABSTRACT

Obtaining physical model data for CAD model generation with a process that includes: receiving a first acceleration-based path data set including acceleration data for an accelerometer device as it was traced over a first path along the surface of a physical object, converting the first acceleration-based path data set to a first position-based data set including position data for the accelerometer as it was traced over the first path along the surface of the physical object, and generating a three dimensional object model data set based, at least in part on the position data of the first position-based data set.

20 Claims, 5 Drawing Sheets

(56) References Cited

U.S. PATENT DOCUMENTS

| | | | |
|---|---|---|---|
| 2009/0323121 A1 | 12/2009 | Valkenburg et al. | |
| 2011/0213226 A1* | 9/2011 | Miller | A61B 5/061 |
| | | | 600/323 |
| 2012/0062701 A1 | 3/2012 | Dillon et al. | |
| 2012/0218444 A1 | 8/2012 | Stach | |
| 2012/0281087 A1 | 11/2012 | Kruse | |
| 2013/0278600 A1 | 10/2013 | Christensen et al. | |
| 2014/0375769 A1 | 12/2014 | Algreatly | |
| 2015/0120080 A1* | 4/2015 | Densham | A63J 1/00 |
| | | | 700/302 |

OTHER PUBLICATIONS

U.S. Appl. No. 15/139,387 entitled "Creating Three Dimensional Models With Acceleration Data", filed Apr. 27, 2016.
Elliott, M., "Quickly measure rooms, create floor plans with MagicPlan", May 18, 2012, <http://howto.cnet.com/8301-11310_39-57437176-285/quickly-measure-rooms-create-floor-plans-with-magicplan/>.
Google, "Google Sky Map Explore the skies on your Android phone", © 2011 Google, <http://www.google.com/mobile/skymap/>.
Google, "Google Play Smart Ruler", Smart Tools co., © 2012 Google, <https://play.google.com/store/apps/details?id=kr.sira.ruler&hl=en>.
Haslam, O., "Microsoft App Creates 3D Models Using a Smartphone", Redmond Pie, Mar. 25, 2011, Copyright 2008-2013 Redmond Pie.
Hurley, S., "From iPhone 4S Photo to 3D Model", All Things Autodesk & Technology, Oct. 22, 2011, <http://autodesk.blogs.com/between_the_lines/2011/10/from-iphone-4s-photo-to-3d-model.html>.
Kukko, A., et al., "Multiplatform Mobile Laser Scanning: Usability and Performance", Sensors 2012, 12, 11712-11733; doi:10.3390/s120911712, ISSN 1424-8220, Published: Aug. 29, 2012.
Newman, J., "Matterport Developing Low Cost 3D Scanner", Rapid Ready Technology, Published May 4, 2012.
Sheetrit, I., "i-Ruler", Updated: Mar 22, 2013, Copyright © 2013 Apple Inc., <https://itunes.apple.com/us/app/i-ruler/id474785950?mt=8>.
Solsie, "3D Model Photo Created with Smartphone", SolSie.com, Mar. 25(http://solsie.com/2011/03/3d-model-photo-created-with-smartphone/), Microsoft Research.
Slick, J., "7 Common Modeling Techniques for Film and Games", An Introduction to 3D Modeling Techniques, About.com, 3D Electronics, © 2013 About.com.
Surur, "Do 3D Modelling on your Windows Mobile Phone", Mar. 13, 2009, WMPoweruser The largest independent Windows Phone community.
Teo, L., "iSculptor modeling app for iPhone/iPad", cg channel.com, Friday May 7, 2010.
"iPhone and iTouch. The Latest in Home Improvement Tools?", May 2013, <http://www.showroom411.com/news/iphone-itouch-the-latest-in-home-improvement-tools/238>, Copyright 2007, RTM Directories, Inc.
"iPhone gets 3D scanner app", Jan. 7, 2011, NeoMetrix Specializes in 3D Measurement Equipment for Digitizing, Reverse Engineering, Computer Aided Inspection Orlando, Florida, <http://www.3dscanningservices.net/News/iPhone gets 3D scanner app>.
"MicroScribee 3D Digitizer Solutions", Copyright © 1996-2010 Ghost 3D, LLC., <http://microscribe.ghost3d.com/gt_microscribe.htm>.
"10 Creative Ways to Use the Accelerometer (iPhone)", Creative Application Network, Posted on: Jan. 13, 2009, <http://www.creativeapplications.net/iphone/10-creative-ways-to-use-the-accelerometer-iphone/>.
"3D modeling", Wikipedia, the free encyclopedia, page last modified on Jun. 14, 2013 at 03:04, <http://en.wikipedia.org/w/index.php?title=3D_modeling&oldid=559816074>.

* cited by examiner

CREATING THREE DIMENSIONAL MODELS WITH ACCELERATION DATA

FIELD OF THE INVENTION

The present invention relates generally to the field of three dimensional (3D) computer graphics, and more particularly to generating 3D models with acceleration data.

BACKGROUND OF THE INVENTION

It is known that acceleration can be used to calculate the position (or displacement) of an object, and this is often done by the calculus operation called integration. If an acceleration history of an object is known, and, further, the position of that object in at least one point in time (for example, a starting point position) is known then complete position history information for the object's path in three dimensional space can be calculated based on the acceleration history. This type of complete positional history will herein be referred to as a "located path." On the other hand, if no reference positions are known for the object, but, rather, only acceleration history then a positional path geometry can be determined, but not the position and/or angular orientation of the path in three dimensional space. This type of more limited positional history will herein be referred to as a "relative path." In three dimensional space, objects have six degrees of freedom of movement/constraint (three translational and three rotational). However, some systems only require consideration of some sub-set of the six degrees to form a useful located or relative path. An accelerometer is defined herein as the category of devices that measure acceleration, over time, of the accelerometer device itself, with respect to at least one degree of freedom/constraint.

3D modeling and computer aided drafting is used in many disciplines and can be used for many different purposes including: (i) reverse engineering; (ii) development; and/or (iii) problem solving. In 3D computer graphics, 3D modeling is the process of developing a mathematical representation of any three-dimensional surface of an object (either inanimate or living) via specialized software. The product is called a 3D model. It can be displayed as a two-dimensional image through a process called 3D rendering or used in a computer simulation of physical phenomena. The model can also be physically created using 3D printing devices. Current systems for 3D modeling are expensive, large, and complex.

SUMMARY

A method is presented for obtaining physical model data for CAD model generation including: receiving a first acceleration-based path data set including acceleration data for an accelerometer device as it was traced over a first path along the surface of a physical object, converting the first acceleration-based path data set to a first position-based data set including position data for the accelerometer as it was traced over the first path along the surface of the physical object, and generating a three dimensional object model data set based, at least in part on the position data of the first position-based data set.

DETAILED DESCRIPTION

This Detailed Description section is divided into the following sub-sections: (i) The Hardware and Software Environment; (ii) First Embodiment; (iii) Further Comments and/or Embodiments; and (iv) Definitions.

I. THE HARDWARE AND SOFTWARE ENVIRONMENT

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer readable program code/instructions embodied thereon.

Any combination of computer-readable media may be utilized. Computer-readable media may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java (note: the term(s) "Java" may be subject to trademark rights in various jurisdictions throughout the world and are used here only in reference to the products or services properly denominated by the marks to the extent that such trademark rights may exist), Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Figure 1:
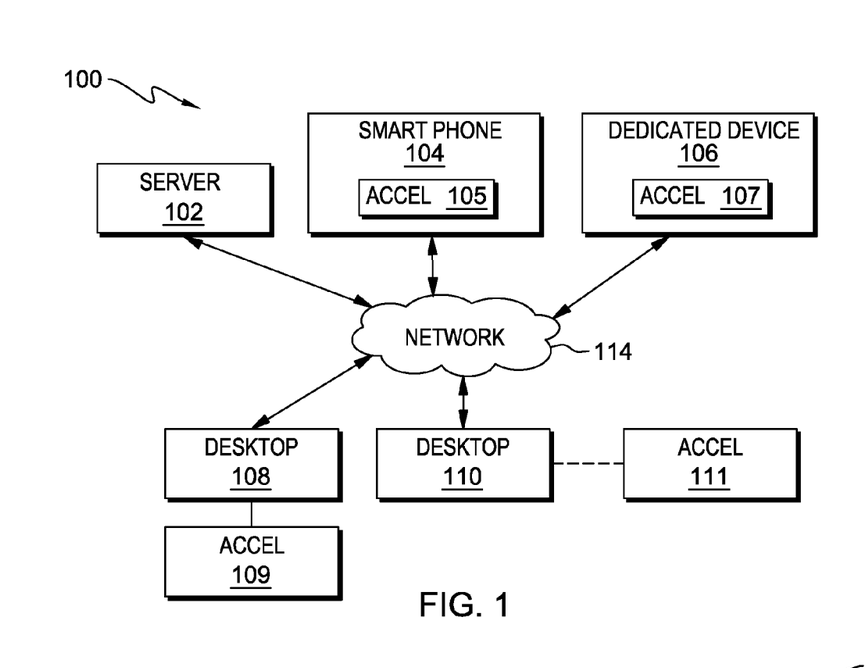
FIG. 1 is a schematic view of a first embodiment of a networked computers system according to the present invention.
Figure 2A:
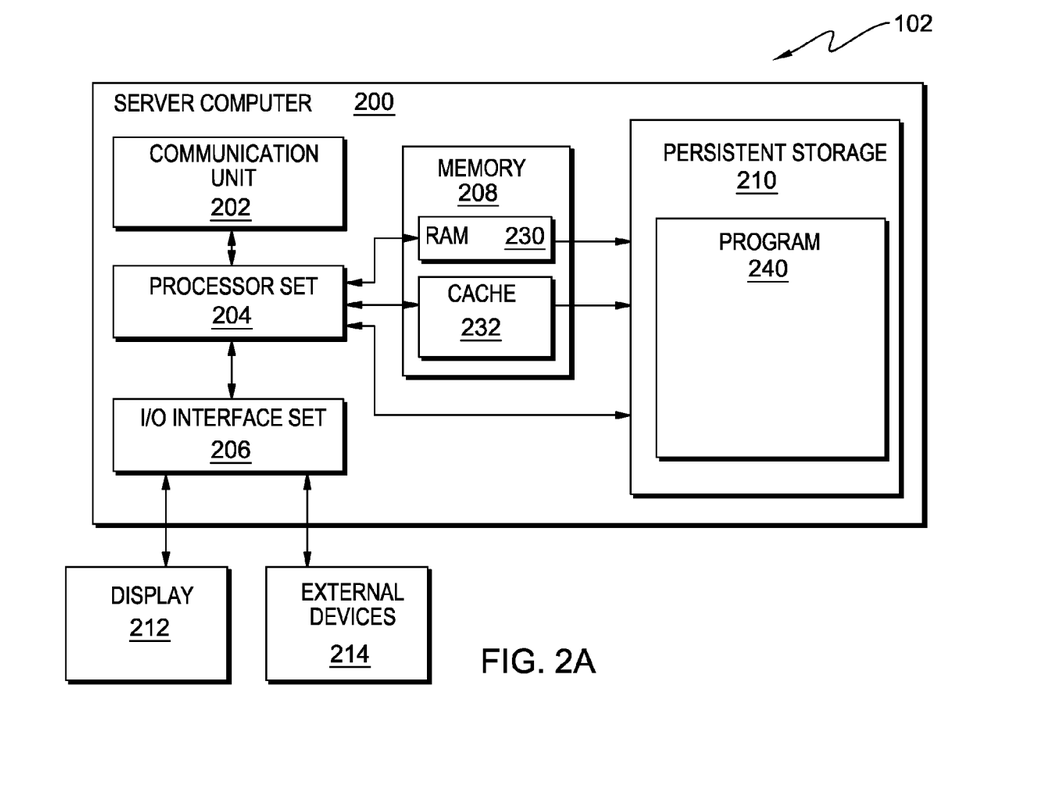
FIG. 2A is a schematic view of a server computer sub-system portion of the first embodiment networked computers system.
Figure 2B:
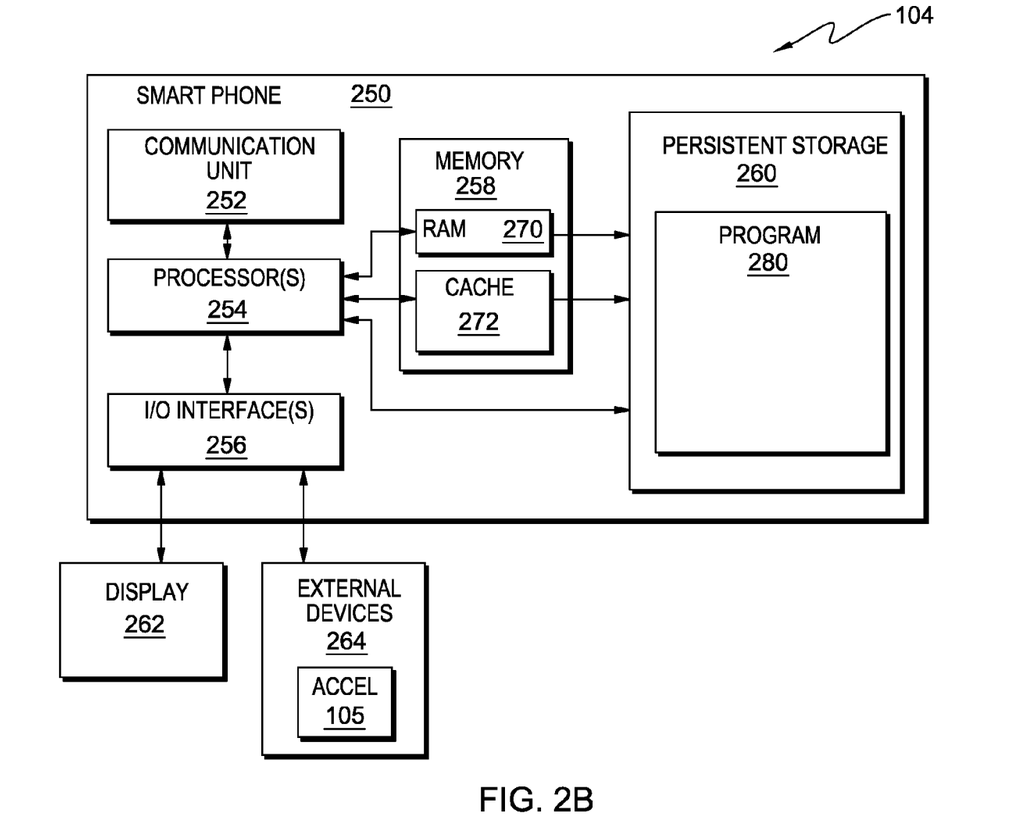
FIG. 2B is a schematic view of a smart phone sub-system portion of the first embodiment networked computers system.

An embodiment of a possible hardware and software environment for software and/or methods according to the present invention will now be described in detail with reference to the Figures. FIGS. 1, 2A and 2B collectively make up a functional block diagram illustrating various portions of networked computers system 100, including: server computer sub-system (that is, a portion of the larger computer system that itself includes a computer) 102; smart phone sub-system 104; smart phone accelerometer 105; dedicated computer sub-system 106; embedded accelerometer 107; desktop computer sub-system 108; external accelerometer 109; desktop computer sub-system 110; external wireless accelerometer 111; communication network, or cloud, 114; server computer 200; communication unit 202; processor set 204; input/output (i/o) unit 206; memory device 208; persistent storage device 210; display device 212; external device set 214; random access memory (RAM) devices 230; cache memory device 232; program 240; smart phone 250; communication unit 252; processor set 254; input/output (i/o) unit 256; memory device 258; persistent storage device 260; display device 262; external device set 264, including smart phone accelerometer 105; random access memory (RAM) devices 270; cache memory device 272; and program 280.

As shown in FIG. 2A, server computer sub-system 102 is, in many respects, representative of the various computer sub-system(s) in the present invention. Accordingly, several portions of computer sub-system 102 will now be discussed in the following paragraphs.

Server computer sub-system 102 may be a laptop computer, tablet computer, netbook computer, personal computer (PC), a desktop computer, a personal digital assistant (PDA), a smart phone, or any programmable electronic device capable of communicating with the client sub-systems via network 114. Program 240 is a collection of machine readable instructions and/or data that is used to create, manage and control certain software functions that will be discussed in detail, below, in the First Embodiment sub-section of this Detailed Description section.

Server computer sub-system 102 is capable of communicating with other computer sub-systems via network 114 (see FIG. 1). Network 114 can be, for example, a local area network (LAN), a wide area network (WAN) such as the Internet, or a combination of the two, and can include wired, wireless, or fiber optic connections. In general, network 114 can be any combination of connections and protocols that will support communications between server and client sub-systems.

It should be appreciated that FIGS. 1, 2A and 2B, taken together, provide only an illustration of one possible implementation of a system according to the present invention and shall not be taken to imply any limitations with regard to other possible implementations. Many modifications to the depicted environment may be made, especially with respect to current and anticipated future advances in cloud computing, distributed computing, smaller computing devices, network communications and the like.

As shown in FIG. 2A, server computer sub-system 102 is shown as a block diagram with many double arrows. These double arrows (no separate reference numerals) represent a communications fabric, which provides communications between various components of sub-system 102. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory 208 and persistent storage 210 are computer-readable storage media. In general, memory 208 can include any suitable volatile or non-volatile computer-readable storage media. It is further noted that, now and/or in the near future: (i) external device(s) 214 may be able to supply, some or all, memory for sub-system 102; and/or (ii) devices external to sub-system 102 may be able to provide memory for sub-system 102.

Program 240 is stored in persistent storage 210 for access and/or execution by one or more of the respective computer processors 204, usually through one or more memories of memory 208. Persistent storage 210: (i) is at least more persistent than a signal in transit; (ii) stores the device on a tangible medium (such as magnetic or optical domains); and (iii) is substantially less persistent than permanent storage. Alternatively, data storage may be more persistent and/or permanent than the type of storage provided by persistent storage 210.

Program 240 may include both machine readable and performable instructions and/or substantive data (that is, the type of data stored in a database). In this particular embodiment, persistent storage 210 includes a magnetic hard disk drive. To name some possible variations, persistent storage 210 may include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer-readable storage medium that is also part of persistent storage 210.

Communications unit 202, in these examples, provides for communications with other data processing systems or devices external to sub-system 102, such as smart phone sub-system 104; dedicated computer sub-system 106; desktop computer sub-system 108; and desktop computer sub-system 110. In these examples, communications unit 202 includes one or more network interface cards. Communications unit 202 may provide communications through the use of either or both physical and wireless communications links. Any software modules discussed herein may be downloaded to a persistent storage device (such as persistent storage device 210) through a communications unit (such as communications unit 202).

I/O interface(s) 206 allows for input and output of data with other devices that may be connected locally in data communication with server computer 200. For example, I/O interface 206 provides a connection to external device set 214. External device set 214 will typically include devices such as a keyboard, keypad, a touch screen, and/or some other suitable input device. External device set 214 can also include portable computer-readable storage media such as, for example, thumb drives, portable optical or magnetic disks, and memory cards. Software and data used to practice embodiments of the present invention, for example, program 240, can be stored on such portable computer-readable storage media. In these embodiments the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

II. FIRST EMBODIMENT

Preliminary note: The flowchart and block diagrams in the following Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 3:
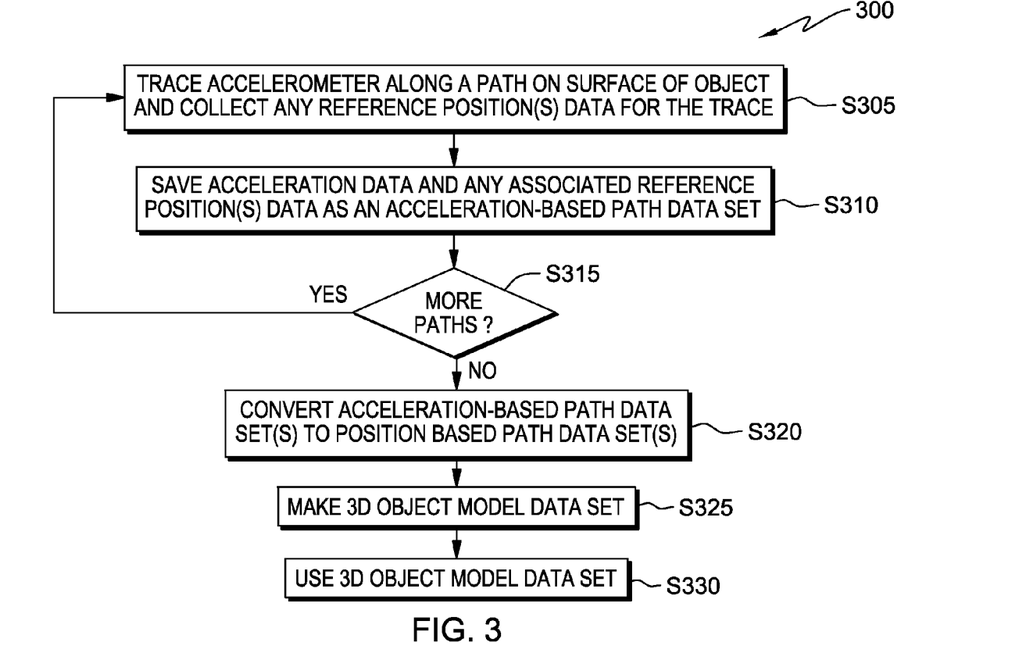
FIG. 3 is a flowchart showing a process performed, at least in part, by the first embodiment networked computers system.
Figure 4A:
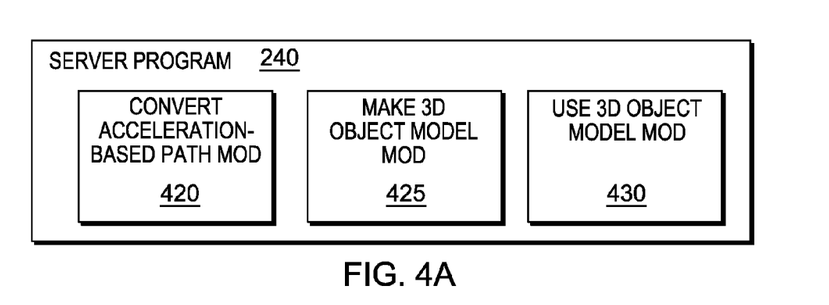
FIG. 4A is a schematic view of a software portion of the server computer sub-system of FIG. 2A.
Figure 4B:
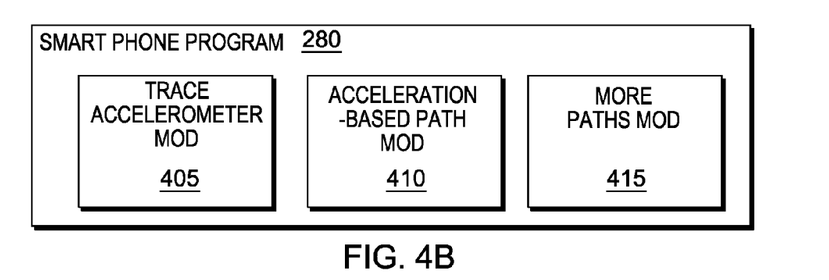
FIG. 4B is a schematic view of a software portion of the smart phone sub-system of FIG. 2B.

FIG. 3 shows a flow chart 300 depicting a method according to the present invention. FIGS. 4A and 4B show server program 240 and smart phone program 280 for performing at least some of the method steps of flow chart 300. This method and associated software will now be discussed, over the course of the following paragraphs, with extensive reference to FIG. 3 (for the method step blocks) and FIGS. 4A and 4B (for the software blocks).

Processing begins at step S305, where trace accelerometer module 405 of smart phone sub-system 104 collects acceleration data and any reference position(s) data from tracing accelerometer 105 along a path on the surface of an object in space. For example, accelerometer 105 (which is part of and mechanically rigidly connected to the rest of smart phone sub-system 104) is manipulated by a user (not shown) to trace paths on the surface of a femur bone of a dinosaur. As the femur is traced, accelerometer device 105 sends raw data to module 405, module 405 collects the acceleration history of the accelerometer device, and the paths are traced. The traced path may have any sort of path geometry including: (i) a straight line; (ii) a conic section; (iii) a higher degree curve; and/or (iv) a combination of curves.

In addition to the acceleration history, module 405 determines at least one reference position for each path so that the traced paths are "located paths" that are located and/or angularly oriented in space relative to each other. This is helpful in creating a 3D model, and the determination of reference positions will be further discussed, below, in the Further Comment(s) and/or Embodiment(s) sub-section of this Detailed Description section.

Alternatively, some embodiments of the present invention may use relative paths, although these relative paths would eventually need to be located and angularly in space, relative to each other, in order to build a 3D model. For example, in one alternative embodiment, a human user would locate and orient multiple relative paths to form the 3D model. As another example of a relative path type embodiment, if a single path includes a trace over substantially the entire outer surface of the physical object to be modeled (and assuming that the physical object remains stationary over the course of the comprehensive trace), then no reference position(s) are necessarily needed to create a 3D model.

In this embodiment, the beginning and end of the tracing of step S305 is provided by a human user. For example, the start and end of the trace may be indicated by touching a "button" on a touchscreen of the smart phone into which the accelerometer is built. Alternatively, the beginning and end of the tracing could be detected automatically by software and/or hardware, such as by determining the beginning and end of the tracing motion of the accelerometer by determining automatically when the accelerometer comes into, and subsequently loses contact (or at least very close proximity) with the traced object.

In this embodiment, the user performs the tracing. However, in some embodiments the tracing motion may be provided by robotic hardware. (See definition, below, of "user" in the Definitions sub-section of this Detailed Description section.)

Processing proceeds to step S310, where acceleration-based path module 410 of smart phone sub-system 104 saves acceleration history and location reference position data, generated at step S305, as an "acceleration-based path data set." The data set is called acceleration based because it is at least substantially based upon acceleration type motion data, as opposed to being based primarily and directly on detected position data, detected velocity data and/or other types of data upon which a path in space might be based.

Embodiments of the present disclosure that use acceleration data may have one, or more, of the following advantages: (i) accelerometers are cheaper than comparable devices, such as those measuring velocity; (ii) when acceleration data is combined with the starting position data and time stamps, the detected position can be more accurate than other means; (iii) the acceleration data is typically available in smart devices, so many embodiments of the present invention do not require additional software installation to operate; (iv) ongoing adoption of accelerometers in mass-production environments (such as smart phones and video game controllers); (v) continuing mass production of accelerometers likely to lead to further, future cost decreases; and/or (vi) continuing mass production of accelerometers likely to lead to further, future advances in accelerometer technology (for example, better accuracy, better precision, reliability, smaller hardware, improved software control).

Processing proceeds to step S315, where more paths module 415 of smart phone sub-system 104 determines whether another acceleration-based path data set is to be created. The determination may be based on various factors including, but not limited to: (i) user input indicating that another path is being traced; (ii) user input indicating that another path will be traced; (iii) user input indicating that no more paths will be traced; or (iv) a previously received total number of paths to be traced. If another acceleration-based path data set will be created, processing returns to step S305, where trace accelerometer module 405 collects acceleration history and any reference position(s) data by tracing another path on the surface of the object.

If no additional acceleration path data sets will be created, processing proceeds to step S320, where convert acceleration-based path module 420 of the server computer sub-system receives (over network 114, see FIG. 1) and then converts the acceleration-based path data set(s) to position-based path data set(s). Server computer 200 and smart phone 250 communicate through network 114, whether a cloud network or other form of network, via communication units 202 and 252. Module 415 provides acceleration-based path data set(s) to the convert acceleration-based path module. Conversion of the acceleration-based data set(s) to position-based data set(s) is discussed in more detail below. Additional methods of conversion should also be known to persons of ordinary skill in the art.

Processing proceeds to step S325, where make 3D object model module 425, of the server computer sub-system, processes the position-based path data set(s) to create a 3D object model. When the acceleration-based path data set is converted to a position-based path data set, a position-based 3D mesh can be constructed. If the position-based path data set includes reference position(s) data, the 3D mesh will place each 3D path in proper spatial relationship with the other 3D paths. Alternatively, manual manipulation of the relative paths may add relative location information while the 3D mesh is manually created. Examples of software that creates 3D models from position-based path data set(s) include: (i) AutoCAD; (ii) ProEngineer; and (iii) Solid Works. (Note: the term(s) "AutoCAD," "ProEngineer," and/or "Solid Works" may be subject to trademark rights in various jurisdictions throughout the world and are used here only in reference to the products or services properly denominated by the marks to the extent that such trademark rights may exist.)

Processing proceeds to step S330, where use 3D object model module 430, of the server computer sub-system, provides the 3D model to programs as called upon for the model. For example, the 3D model of the dinosaur femur may be called upon by a program to determine characteristics of the corresponding dinosaur, such as: (i) species; (ii) height; (iii) age; and/or (iv) weight.

Modules 420, 425, and 430 are shown as part of server program 240. It should be noted that this is just one embodiment where the computing power of the server is advantageously used. In the illustrated configuration, the smart phone is not burdened with high-memory activities such as: (i) converting the acceleration-based path data set(s) to position-based data set(s); (ii) storing the 3D model; and/or (iii) manipulating the 3D model.

III. FURTHER COMMENTS AND/OR EMBODIMENTS

Some embodiments of the present invention provide a cost effective and easy-to-use alternative to available 3D modeling solutions, such as 3D scanners.

Some embodiments of the present invention provide a method for a user to make easy, accurate and reliable 3D models with smart devices. Further, some embodiments of the present invention use cloud computing on the 3D model to take advantage of creative uses of distributed computing. Some examples of such uses are discussed below.

Some embodiments of the present invention use smart mobile devices to create accurate 3D models, which can be used for various purposes. These models can then be shared with the cloud, in order to do various forms of computation. Alternatively, the data points obtained by the smart device may be transferred to 3D rendering software available in the cloud. Alternatively, data points obtained in different geographic locations may be uploaded to the cloud and combined to form a single 3D image comprising data from both locations. For example, two components of an assembly may be uploaded from different production facilities for 3D printing and assembly.

Some embodiments of the present invention provide an easy way to accurately record the scale of the object being modeled.

Some embodiments of the present invention use simple techniques and a combination of information to create accurate and reliable 3D models that provide additional insight, such as: (i) perimeters of odd shaped objects; and/or (ii) object volume estimates. Once a model is generated, this model can be shared with the cloud for various computational purposes.

Some embodiments of the present invention include one or more of the following: (i) a smart phone, tablet, or other smart device; (ii) an accelerometer, gyroscope, tiltmeter (or inclinometer) or equivalent; (iii) a touch screen; (iv) internal computation; an attachment that allows for functionality similar to the touch screen; (v) an attachment that allows for sonar-like 3D modeling methods; and/or (vi) available cloud computing.

Some embodiments of the present invention provide a method for scanning a 3D model, including the steps of: (i) place the smart device on the object to be scanned; (ii) place a finger on the touch screen; (iii) calculate the starting point with X, Y, Z coordinates (i.e. the point in space where the finger is placed); (iv) slide the device along the surface of the object, while keeping the finger still (in effect dragging the finger along the surface of the touch screen, except it is the device that is moving, not the finger); (v) responsive to the finger reaching the edge of the device, pick up the finger; (vi) place the finger on another spot on the touch screen; (vii) calculate the next point in space with X,Y,Z coordinates with reference to the starting point; (viii) slide the device along the surface of the object, while keeping the finger still; (ix) repeat steps (v)-(viii) until enough samples are taken to create a 3D mesh representing the object.

Some embodiments of the present invention provide a ruler application that can be created by using the length of the touch screen and dragging motion of the device under the user's finger to get a good idea on the length of objects and capturing information provided by the accelerometer, such as detecting the angle and/or position of the smart device. The accelerometer information provides the direction that the device moves as the finger slides across the screen, or as an attachment moves with the device. While dragging a finger, or using an attachment, information about distance is captured and sample points are generated. At the same time, information about the position of the device is also captured and stored with each of these sample points in three-dimensional space. More sample points yield more accurate models. Once enough sample points have been obtained, a 3D model can be generated by extrapolation and other common methods. The model can then be used, for its intended purpose.

Some embodiments of the present invention provide that once a model is generated, the model can be shared with the cloud for various computational purposes. For example, consider calculating the volume of a complex 3D shape, such as an irregular shaped swimming pool, to determine how much pool chemicals to add to it. The odd shape would make it difficult for someone to accurately estimate volume of the pool by hand. However using our invention, they would be able to obtain an accurate estimate, in a short period of time.

Figure 5:
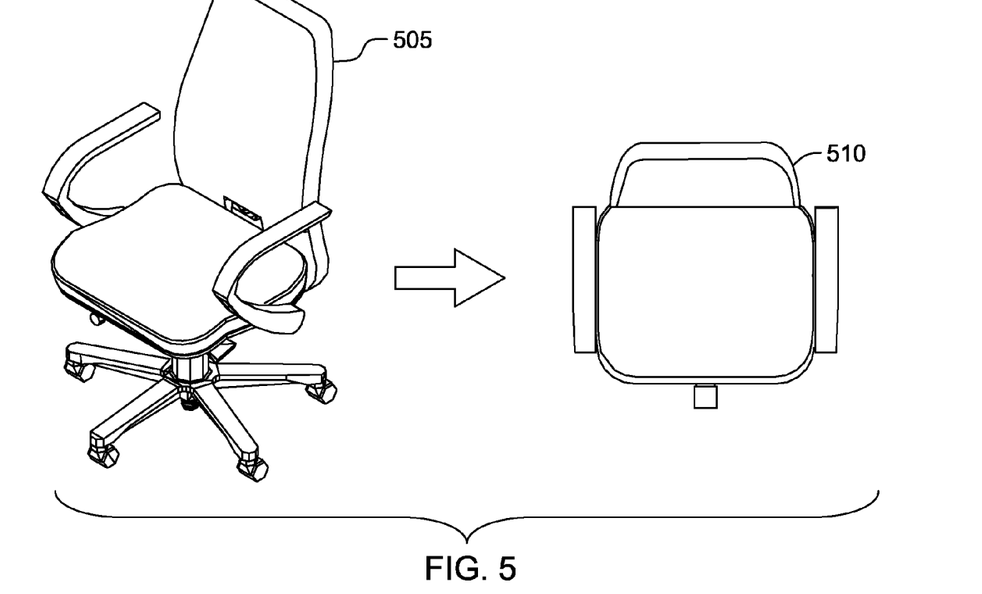
FIG. 5 is an illustration of a perimeter created from scanning a physical object according to an embodiment of the present invention.

Some embodiments of the present invention interface with computer aided design (CAD) integrator products. CAD integrators maintain blueprint drawings of buildings having architectural data down to the individual space and various assets in the space level. A space can be in the form of a room, cubicle, open area, hallway, lobby, or any other area. Some embodiments of the present invention recognize that a problem may exist in obtaining accurate profiles for placement of assets like desks, chairs, and other furniture in the spaces. For example, FIG. 5 shows how office chair 505 may be traced to produce top view 510 for placement in a 2D office layout. By using the mobile device, the 3D shape of the asset, such as the office chair can be captured, then transformed into a 2D perimeter to be placed in the CAD drawing.

This would be useful when taking inventory of assets, and placing them into the drawing. By storing the 3D models and/or data files in the cloud, the 3D shapes could be accessed and transformed into the 2D perimeter to be placed in CAD drawings at a remote site based on the location-based services of the mobile device when the physical object is scanned.

Some embodiments of the present invention have health and/or medical industry applications. For example, measuring portions of the human body may provide useful information to doctors for use in medical analysis.

Some embodiments of the present invention offer online retail and commerce applications. For example, online retailers could take advantage of measurements of the human body to determine proper apparel sizes. Online retailers will benefit from a clothing size application because there are no physical locations for customers to try on apparel. One way that online retailers attract business is to offer free return shipping for items purchased online, but don't fit when they reach the customer. If clothing size is determined using the customer's smart phone the cost of returning the incorrect size apparel would be significantly reduced.

Some embodiments of the present invention provide a hardware attachment to smart devices, which can be used for measuring the distance of 3D surfaces. Hardware attachments include, but are not limited to: (i) mouse ball(s) and the like; (ii) laser scanner(s); (iii) sonar techniques.

Some embodiments of the present invention measure objects by a user dragging her finger across a smart device's touch screen.

Some embodiments of the present invention take sample points of a 3D object by detecting with an accelerometer, the relationship between a user's finger location and the incremental location of the moving smart device.

Some embodiments of the present invention create 3D meshes used with 3D modeling from the sample points obtained by the accelerometer.

Some embodiments of the present invention use the sample points obtained by the accelerometer to extrapolate 3D models Some embodiments of the present invention share sample points obtained by smart devices with the cloud for cloud computing. In that way, the computing power required to generate the 3D model may be in the cloud rather than on the smart device itself.

Some embodiments of the present invention share generated 3D models with the cloud for cloud computing for the purposes including: (i) calculating the volume of objects; and (ii) calculating the perimeter of objects.

Some embodiments of the present invention use 3D models created by smart devices to transfer clothing sizes to clothing retailers.

Some embodiments of the present invention recognize that 3D printer technology is a significant advance in "democratization of design," but traditional desktop modeling tools do not reach the large audience that would use this technology. Mobile devices, however, are ubiquitous and oftentimes include accelerometers and gyroscopes to support applications such as those using global positioning technology. Alternatively, there are add-on devices for smart phones that offer a lower cost to the consumer than fully integrated systems.

Some embodiments of the present invention use smart mobile devices to create accurate 3D models. The information from smart phone sensors is used to generate vectors outlining an tangible object being "traced."

Some embodiments of the present invention use double integration to develop 3D models from the data points generated from smart device data, including, but not limited to: (i) accelerometer data; and (ii) gyroscope data. Oftentimes, 3D models are generated by a set of data points that create a wire model, or 3D mesh.

Some embodiments of the present invention create a wire model by: (i) reducing acceleration data to a set of points in 3D; (ii) integrating acceleration to velocity and a time constant; (iii) integrating velocity to a point and a starting point constant; and (iv) determining the starting point constant by identifying the value of the position function at one point.

Some embodiments of the present invention obtain the following information from the smart device: (i) acceleration; and (ii) time. Two example reasons for using acceleration data are: (i) accelerometers are cheaper than comparable devices, such as those measuring velocity; and (ii) when acceleration data is combined with the starting position data and time stamps, the detected position can be more accurate than other means. The point data is determined by the 3D modeling application using methods including, but not limited to: (i) input from the user dragging a smart device while holding a finger on the touch screen in a fixed location in space; and/or (ii) input from the user while holding an add-on attachment to smart device.

Figure 6:
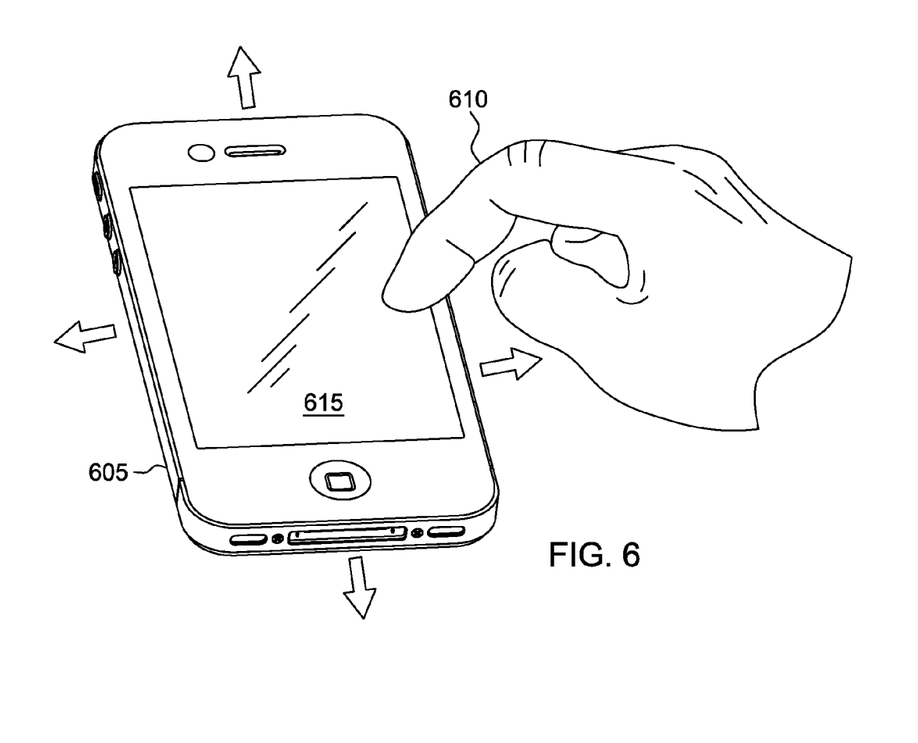
FIG. 6 is an illustration of the use of a cell phone according to an embodiment of the present invention.

Some embodiments of the present invention use the following method depicted in FIG. 6 to obtain input from the user dragging smart device 605 while holding finger 610 on the touch screen 615 in a fixed location in space: (i) hold the finger stationary at a point in space while in contact with the touch screen; (ii) move the smart device under the stationary finger while maintaining finger contact with the touch screen; (iii) when the finger reaches an edge of the touch screen, the finger is repositioned on the touch screen while the smart device is held stationary. While the user is tracing the surface of the object, the smart device provides the spatial data required for a 3D rendering through data communication with an accelerometer and/or gyroscope.

Figure 7:
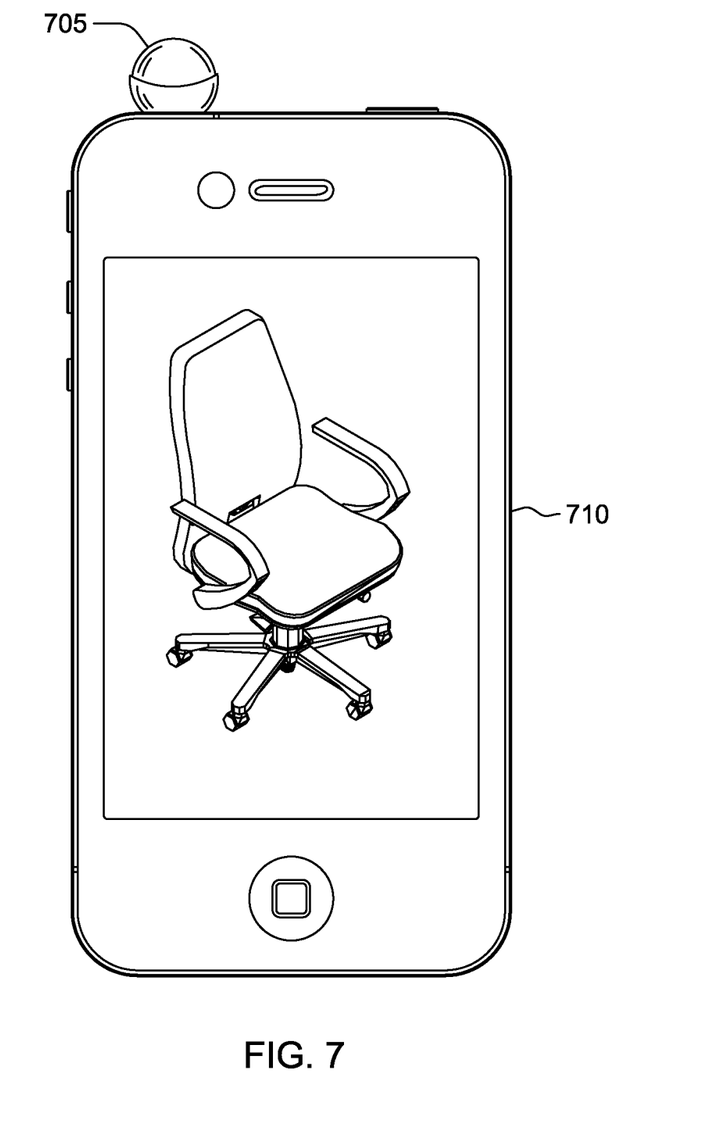
FIG. 7 is an illustration of an add-on device for a cell phone for use in a method that practices an embodiment of the present invention.

Some embodiments of the present invention use an attachment, such as the attachment shown in FIG. 7, where track ball 705 is attached via an audio interface to smart phone 710. Alternatively, a sonar emitting device may be attached to the smart phone, or a laser scanning device may be attached to the smart phone.

Some embodiments of the present invention use a CAD integrator that is stored in cloud for the computation of space assignment.

Some embodiments of the present invention provide a system for rendering 3D models of physical objects using a smart phone or tablet whereby the tablet traces contours of the physical object while a user's finger remains stationary, but in contact with the scanning device, to serve as a point of reference. The contours are constructed via a series of integrations from recorded temporally sampled acceleration vectors, using the mobile device's accelerometer. Contours are then pieced together to construct a 3D wireframe model.

Some embodiments of the present invention combine data from one or more of the following: (i) an audio-ball; (ii) a touch screen; (iii) a gyroscope; and/or (iv) an accelerometer.

Some embodiments of the present invention combine 2D data from the audio ball with 3D data supplied by the accelerometer of the smart device.

Some embodiments of the present invention requires physically touching the physical object being drawn with the smart device, such as a smart phone. Physical contact eliminates concerns that arise when photograph or other image rendering software is used for objects having reflective surfaces, such as chrome automotive bumpers.

IV. DEFINITIONS

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: non-exclusive or; for example, A and/or B means that: (i) A is true and B is false; or (ii) A is false and B is true; or (iii) A and B are both true.

User/subscriber: includes, but is not necessarily limited to, the following: (i) a single individual human; (ii) an artificial intelligence entity with sufficient intelligence to act as a user or subscriber; and/or (iii) a group of related users or subscribers.

Data communication: any sort of data communication scheme now known or to be developed in the future, including wireless communication, wired communication and communication routes that have wireless and wired portions; data communication is not necessarily limited to: (i) direct data communication; (ii) indirect data communication; and/or (iii) data communication where the format, packetization status, medium, encryption status and/or protocol remains constant over the entire course of the data communication.

Software storage device: any device (or set of devices) capable of storing computer code in a non-transient manner in one or more tangible storage medium(s); "software storage device" does not include any device that stores computer code only as a signal.

Computer: any device with significant data processing and/or machine readable instruction reading capabilities including, but not limited to: desktop computers, mainframe computers, laptop computers, field-programmable gate array (fpga) based devices, smart phones, personal digital assistants (PDAs), body-mounted or inserted computers, embedded device style computers, application-specific integrated circuit (ASIC) based devices.

What is claimed is:

1. A computer-implemented method for obtaining physical model data for CAD model generation, the method comprising:
    identifying a start point indicator sent from an accelerometer device;
    recording a first time stamp corresponding to a start time when the start point indicator was identified;

identifying a stop point indicator sent from the accelerometer device;
recording a second time stamp corresponding to a stop time when the stop point indicator was identified;
determining a first acceleration-based path data set including acceleration data from the accelerometer device beginning at the start time and continuing while the accelerometer device physically moves over a first path along the surface of a physical object until the stop time;
converting, by a processor, the first acceleration-based path data set to a first position-based data set including position data for the accelerometer device as the acceleration device physically moved over the first path along the surface of the physical object; and
generating a three dimensional object model data set based, at least in part on the position data of the first position-based data set, the three dimensional object model data set including data to represent the physical object as a CAD model.

2. The method of claim 1 further comprising:
tracing the accelerometer device over the first path along the surface of the physical object.

3. The method of claim 2 wherein tracing is performed by a trackball in electronic communication with the accelerometer device.

4. The method of claim 1 wherein the first acceleration-based path data set further comprises reference position data.

5. The method of claim 4 wherein the reference position data comprises a start point of the first path.

6. The method of claim 1 wherein the accelerometer device is a smart phone.

7. A computer program product for obtaining physical model data for CAD model generation, the computer program product comprising software stored on a software storage device, the software comprising:
first program instructions programmed to identifying a start point indicator sent from an accelerometer device;
second program instructions programmed to recording a first time stamp corresponding to a start time when the start point indicator was identified;
third program instructions programmed to identifying a stop point indicator sent from the accelerometer device;
fourth program instructions programmed to recording a second time stamp corresponding to a stop time when the stop point indicator was identified;
fifth program instructions programmed to determine a first acceleration-based path data set including acceleration data from the accelerometer device beginning at the time and continuing as the accelerometer device is traced over a first path along the surface of a physical object until the stop point indicator is identified;
sixth program instructions programmed to convert the first acceleration-based path data set to a first position-based data set including position data for the accelerometer while the accelerometer device physically moves over the first path along the surface of the physical object; and
seventh program instructions programmed to generate a three dimensional object model data set based, at least in part on the position data of the first position-based data set, the three dimensional object model data set including data to represent the physical object as a CAD model;
wherein:
the software is stored on a software storage device in a manner less transitory than a signal in transit.

8. The computer program product of claim 7 further comprising:
fourth program instructions programmed to, responsive to an acceleration data input from the accelerometer device, generate the first acceleration-based path data set.

9. The computer program product of claim 8 wherein the acceleration data input is communicated by a trackball in electronic communication with the accelerometer device.

10. The computer program product of claim 7 wherein the first acceleration-based path data set further comprises reference position data.

11. The computer program product of claim 10 wherein the reference position data comprises a start point of the first path.

12. The computer program product of claim 7 wherein the accelerometer device is a smart phone.

13. A computer system for obtaining physical model data for CAD model generation, the computer system comprising:
a processor(s) set; and
a software storage device;
wherein:
the processor set is structured, located, connected and/or programmed to run software stored on the software storage device; and
the software comprises:
first program instructions programmed to identifying a start point indicator sent from an accelerometer device;
second program instructions programmed to recording a first time stamp corresponding to a start time when the start point indicator was identified;
third program instructions programmed to identifying a stop point indicator sent from the accelerometer device;
fourth program instructions programmed to recording a second time stamp corresponding to a stop time when the stop point indicator was identified;
fifth program instructions programmed to determine a first acceleration-based path data set including acceleration data from the accelerometer device beginning at the time and continuing as the accelerometer device is traced over a first path along the surface of a physical object until the stop point indicator is identified;
sixth program instructions programmed to convert the first acceleration-based path data set to a first position-based data set including position data for the accelerometer while the accelerometer device physically moves over the first path along the surface of the physical object; and
seventh program instructions programmed to generate a three dimensional object model data set based, at least in part on the position data of the first position-based data set, the three dimensional object model data set including data to represent the physical object as a CAD model.

14. The computer system of claim 13 wherein the software further comprises:
fourth program instructions programmed to, responsive to an acceleration data input from the accelerometer device, generate the first acceleration-based path data set.

15. The computer system of claim 14 wherein the acceleration data input is communicated by a trackball in electronic communication with the accelerometer device.

16. The computer system of claim 13 wherein the first acceleration-based path data set further comprises reference position data.

17. The computer system of claim 16 wherein the reference position data comprises a start point of the first path.

18. The computer system of claim 13 wherein the accelerometer device is a smart phone.

19. The method of claim 4, further comprising:
constructing a three-dimensional mesh of the physical object based at least in part on the reference position data.

20. The method of claim 1, further comprising:
rendering the CAD model using CAD software; and
determining a volume of the physical object from the CAD model.

* * * * *